United States Patent
Kim et al.

(10) Patent No.: US 9,899,990 B2
(45) Date of Patent: Feb. 20, 2018

(54) SEMICONDUCTOR CIRCUIT INCLUDING FLIP-FLOP

(71) Applicant: SAMSUNG ELECTRONICS CO., LTD., Suwon-si, Gyeonggi-Do (KR)

(72) Inventors: San-Ha Kim, Suwon-si (KR); Min-Su Kim, Hwaseong-si (KR); Matthew Berzins, Austin, TX (US)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/253,270

(22) Filed: Aug. 31, 2016

(65) Prior Publication Data

US 2017/0070214 A1 Mar. 9, 2017

(30) Foreign Application Priority Data

Sep. 7, 2015 (KR) .................. 10-2015-0126269

(51) Int. Cl.
 *H03K 3/356* (2006.01)
 *H03K 3/012* (2006.01)

(52) U.S. Cl.
 CPC ....... *H03K 3/012* (2013.01); *H03K 3/356121* (2013.01)

(58) Field of Classification Search
 CPC .................................................. H03K 3/012
 See application file for complete search history.

(56) References Cited

U.S. PATENT DOCUMENTS

| | | | |
|---|---|---|---|
| 5,781,053 A | 7/1998 | Ramirez | |
| 6,678,846 B1 | 1/2004 | Maeno | |
| 6,794,898 B2 | 9/2004 | Komaki | |
| 7,157,930 B2 * | 1/2007 | Hirata | G01R 31/318541 326/16 |
| 7,345,519 B2 | 3/2008 | Hirata | |
| 7,525,361 B2 | 4/2009 | Kim | |
| 7,772,906 B2 | 8/2010 | Naffziger | |
| 7,872,492 B2 | 1/2011 | Pitkethly et al. | |
| 8,103,941 B2 | 1/2012 | Naffziger | |
| 9,035,686 B1 | 5/2015 | Hsu et al. | |

* cited by examiner

*Primary Examiner* — Daniel Puentes
(74) *Attorney, Agent, or Firm* — Volentine & Whitt, PLLC

(57) ABSTRACT

A semiconductor circuit includes a first circuit and a second circuit. The first circuit determines a logic level of a second node and a logic level of a third node, on the basis of a logic level of input data, a logic level of a clock signal, and a logic level of a first node. The second circuit determines the logic level of the first node, on the basis of the logic level of the clock signal, the logic level of the second node and the logic level of the third node. The first circuit comprises a sub-circuit and a first transistor. The first circuit determines the logic level of the second node, on the basis of the logic level of the input data and the logic level of the first node. The first transistor is gated to the logic level of the clock signal to connect the third node with the second node.

18 Claims, 16 Drawing Sheets

SEMICONDUCTOR CIRCUIT INCLUDING FLIP-FLOP

CROSS-REFERENCE TO RELATED APPLICATION

This application claims priority from Korean Patent Application No. 10-2015-0126269 filed on Sep. 7, 2015, in the Korean Intellectual Property Office, the disclosure of which is incorporated herein by reference in its entirety.

BACKGROUND

1. Technical Field

The present disclosure relates to a semiconductor circuit including a flip-flop.

2. Description of the Related Art

More logic circuits are integrated on a single chip due to miniaturization of the process. Thus, a size of a unit cell area of the chip directly impacts the integration of the chip. Also, since the performance of a flip-flop for transmitting data, depending on a clock signal, within a digital system is directly connected to the performance of the system, achievement of a high-speed flip-flop to achieve a high-speed system has increasingly emerged as an important issue.

However, when achieving the high-speed flip-flop, there is a problem of an increase in an area of the flip-flop from the viewpoint of layout.

SUMMARY

Aspects of the present disclosure provide a semiconductor circuit which includes a high-speed flip-flop in which reliability of the product is enhanced and a unit cell area is reduced.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor circuit that includes a first circuit and a second circuit. The first circuit determines a logic level of a second node and a logic level of a third node, on the basis of a logic level of input data, a logic level of a clock signal, and a logic level of a first node. The second circuit determines the logic level of the first node, on the basis of the logic level of the clock signal, the logic level of the second node, and the logic level of the third node. The first circuit comprises a sub-circuit and a first transistor. The first circuit determines the logic level of the second node, on the basis of the logic level of the input data and the logic level of the first node. The first transistor is gated to the logic level of the clock signal to connect the third node with the second node.

According to another aspect of the present disclosure, there is provided a semiconductor circuit that includes a first circuit, a second circuit, and a latch circuit. The first circuit determines a logic level of a second node and a logic level of a third node, on the basis of a logic level of input data, a logic level of a clock signal, and a logic level of a first node. The second circuit determines the logic level of the first node, on the basis of the logic level of the clock signal, the logic level of the second node, and the logic level of the third node. The latch circuit determines a logic level of an output terminal, on the basis of the logic level of the clock signal and the logic level of the third node. When the logic level of the clock signal is a first logic level, the logic level of the second node is transmitted to the third node and the logic level of the third node is transmitted to the output terminal.

According to still another aspect of the present disclosure, there is provided a semiconductor circuit that includes a first circuit, a second circuit, and a latch circuit. The first circuit determines a logic level of a second node and a logic level of a third node, on the basis of a logic level of input data, a logic level of a clock signal, and a logic level of a first node. The second circuit determines the logic level of the first node, on the basis of the logic level of the clock signal, the logic level of the second node, and the logic level of the third node. The latch circuit determines a logic level of an output terminal, on the basis of the logic level of the clock signal and the logic level of the third node. When the logic level of the clock signal or the logic level of the third node is the first logic level, the first node is pre-charged. When the logic level of the clock signal or the logic level of the second node is a second logic level different from the first logic level, the first node is discharged. When the logic level of the clock signal or the logic level of the first node is the first logic level, the third node is pre-charged, and when all of the logic level of the clock signal, the logic level of the input data and the logic level of the first node are the second logic level, the third node is discharged.

According to still another aspect of the present disclosure, there is a provided a semiconductor circuit that includes a first circuit and a second circuit. The first circuit includes a first transistor, a second transistor, and a third transistor. The first transistor is gated to an inverted value of a logic level of a first node to pull up a second node. The second transistor is connected in parallel to the first transistor and is gated to an inverted value of a logic level of a clock signal to pull up the second node. The third transistor is gated to the logic level of the clock signal to make logic levels of the second node and a third node the same. The second circuit includes a fourth transistor, a fifth transistor, a sixth transistor, and a seventh transistor. The fourth transistor is gated to the inverted value of the logic level of the clock signal to pull up the first node. The fifth transistor is connected in parallel to the fourth transistor and is gated to an inverted value of the logic level of the second node to pull up the first node. The sixth transistor is gated to the logic level of the third node to pull down the first node. The seventh transistor is connected in series to the sixth transistor and is gated to the logic level of the clock signal to transmit a ground voltage.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE PRESENT DISCLOSURE

Figure 1:
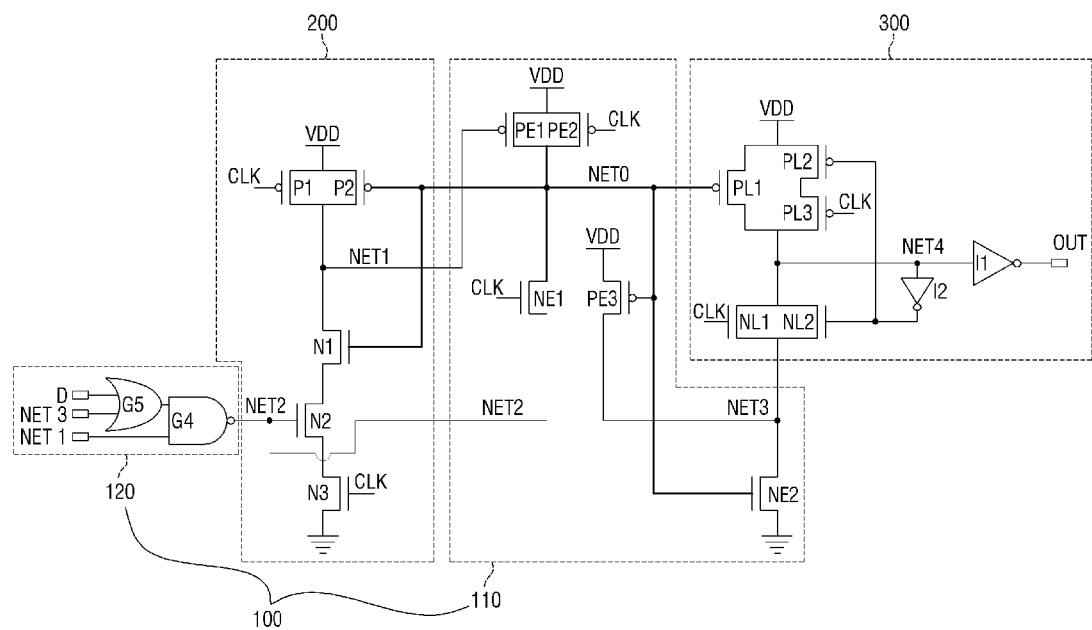
FIG. 1 is a circuit diagram illustrating a semiconductor circuit according to an embodiment of the present disclosure.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the disclosure (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

The present disclosure will be described with reference to perspective views, cross-sectional views, and/or plan views, in which preferred embodiments of the disclosure are shown. Thus, the profile of an exemplary view may be modified according to manufacturing techniques and/or allowances. That is, the embodiments of the disclosure are not intended to limit the scope of the present disclosure but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate the disclosure and is not a limitation on the scope of the disclosure unless otherwise specified. Further, unless defined otherwise, all terms defined in generally used dictionaries may not be overly interpreted.

Figure 2:
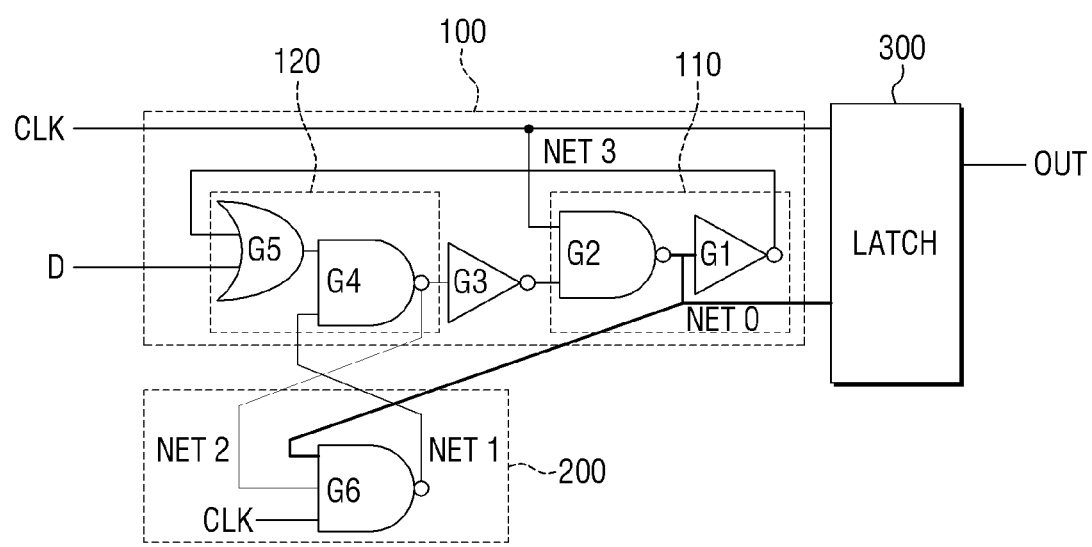
FIG. 2 is a block diagram illustrating a semiconductor circuit according to an embodiment of the present disclosure.
Figure 3:
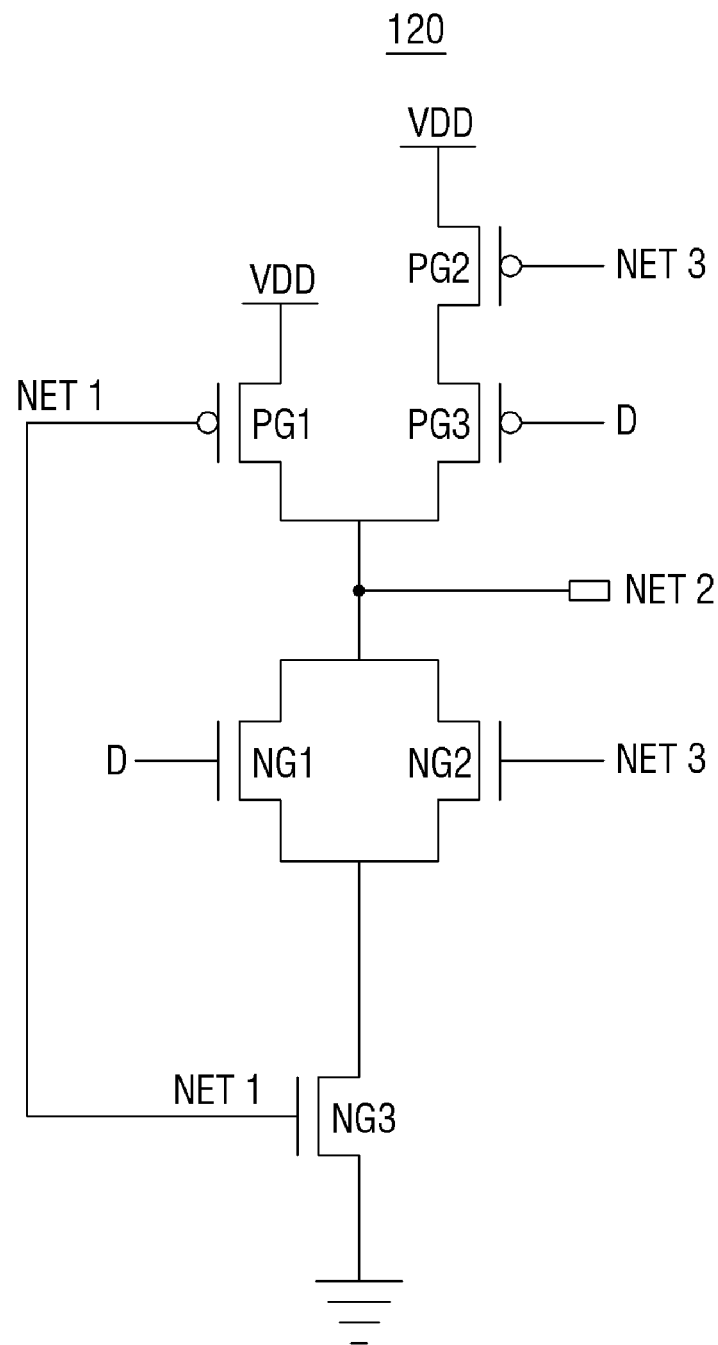
FIG. 3 is a circuit diagram illustrating a second sub-circuit included in a first circuit of FIG. 1.

FIG. 1 is a circuit diagram illustrating a semiconductor circuit according to an embodiment of the present disclosure. FIG. 2 is a block diagram illustrating a semiconductor circuit according to an embodiment of the present disclosure. FIG. 3 is a circuit diagram illustrating a second sub-circuit included in the first circuit of FIG. 1.

Referring to FIGS. 1 and 2, a semiconductor circuit according to an embodiment of the present disclosure includes a first circuit 100, a second circuit 200 and a latch circuit 300.

The first circuit 100 may determine a logic level of a node NET 2 and a logic level of a node NET 0, on the basis of a logic level of input data D, a logic level of a clock signal CLK and a logic level of a node NET 1.

The second circuit 200 may determine the logic level of a node NET 1, on the basis of the logic level of the clock signal CLK, the logic level of the node NET 2 and the logic level of the node NET 0.

The latch circuit may determine a logic level of an output terminal OUT on the basis of the logic level of the clock signal CLK and the logic level of the node NET 0.

At this time, a part of the output of the first circuit 100 may be used as an input of the second circuit 200 and a part of the output of the second circuit 200 may be used as an output of the first circuit 100. The first circuit 100, the second circuit 200 and the latch circuit 300 may operate as a flip-flop. However, the present disclosure is not limited thereto.

In some embodiments of the present disclosure, the first circuit 100 and the second circuit 200 may include a gate of an Or-And-Inverter (OAI) structure. However, the present disclosure is not limited thereto, and the detailed description thereof will be provided below.

Specifically, the first circuit 100 includes a first sub-circuit 110 and a second sub-circuit 120.

The first sub-circuit 110 includes a transistor PE1 gated to an inverted value of the logic level of the node NET 1 to pull up the node NET 0, a transistor PE2 which is connected in parallel with the transistor PE1 and is gated to an inverted value of the logic level of the clock signal CLK to pull up the node NET 0, and a transistor NE1 gated to the logic level of the clock signal CLK to connect the node NET 0 and the node NET 2.

At this time, the transistor NE1 may be located between the node NET 0 and the node NET 2, and may transmit the logic level of the node NET 0 to the node NET 2 when turned on. However, the present disclosure is not limited thereto.

In this embodiment, as illustrated, one side of some of the transistors PE1, PE2 may be connected to the power source voltage VDD, but the present disclosure is not limited thereto. Also, some of the transistors PE1, PE2, for example, may be made up of a PMOS transistor and the remaining transistor NE1, for example, may be made up of an NMOS transistor, but the present disclosure is not limited thereto.

Further, the first sub-circuit 110 may further include a transistor PE3 gated to the inverted value of the logic level of the node NET 0 to pull up the node NET 3, and a transistor NE2 gated to the logic level of the node NET 0 to pull down the node NET 3. Here, the transistor PE3 and the transistor NE2 may operate as an inverter (corresponding to G1 in FIG. 2). Therefore, the node NET 0 and the node NET 3 may have the logic levels opposed to each other. Inverter G3 and NAND gate G2, within FIG. 2, correspond to transistors NE1 and PE2 within FIG. 1. And NAND gate G6, within FIG. 2, corresponds to transistors N1, N2, and N3 within FIG. 1.

In this embodiment, as illustrated, the transistors PE3, NE2 may be connected in series between a power source voltage VDD and a ground voltage, but the present disclosure is not limited thereto. Also, some transistor PE3, for example, may be made up of a PMOS transistor, and the remaining transistor NE2, for example, may be made up of an NMOS transistor, but the present disclosure is not limited thereto.

The second sub-circuit 120 includes a gate G5 which performs an OR operation of the logic level of the input data D and the logic level of the node NET 3, and a gate G4 which performs a NAND operation of the logic level of the output of the gate G5 and the logic level of the node NET 1 to transmit an output value to the node NET 2. That is, the second sub-circuit 120 may be an OAI circuit which transmits the output values to the node NET 2, on the basis of the logic level of the input data D, the logic level of the node NET 3 and the logic level of the node NET 1. However, the present disclosure is not limited thereto. The output value transmitted to the node NET 2 may be input to the second circuit 100 as an input and may be connected to one end of the transistor NE1, but the present disclosure is not limited thereto.

More specifically, referring to FIGS. 1 and 3, the second sub-circuit 120 may include a sub transistor PG2 gated to the inverted value of the logic level of the node NET 3 to provide a power source voltage VDD, a sub-transistor PG3 which is connected in series to the sub-transistor PG2 and is gated to the inverted value of the logic level of the input data D, and a sub-transistor PG1 which is connected in parallel to the sub-transistor PG2 and the sub-transistor PG3 connected in series with each other and is gated to the inverted value of the logic level of the node NET 1 to pull up the node NET 2.

Further, the second sub-circuit 120 may further include a sub-transistor NG3 which is gated to the logic level of the node NET 1 to transmit a ground voltage to the node NET 2, a sub-transistor NG1 which is connected between the sub-transistor NG3 and the node NET 2 and is gated to the logic level of the input data D, and a sub-transistor NG2 which is connected in parallel to the sub-transistor NG1 and is gated to the logic level of the node NET 3.

At this time, the node NET 2 may be pre-charged, when the transistor PG1 is turned on or when the transistor PG2 and the transistor PG3 is turned on. That is, the node NET 2 may have a logic high level (hereinafter, referred to as a high level H). In contrast, the node NET 2 may be discharged, when the transistor NG1 or the transistor NG2 is turned on and at the same time the transistor NG3 is turned on. That is, the node NET 2 may have a logic low level (hereinafter, referred to as a low level L).

Here, the high level H means a logic level of a reference level or higher, and the low level L may mean a logic level of the reference level or less. For example, the high level H means a case of having a value higher than 50% of the logic level, and the low level L may mean a case of having a value less than 50% of the logic level. However, the present disclosure is not limited thereto, and the size of the reference level may be variously changed. Hereinafter, the logic level of the semiconductor circuit will be described as a high level H and a low level L on the basis of this.

In this embodiment, as illustrated, the transistors PG1, PG2, PG3, NG1, NG2, NG3 may be connected in series or in parallel between the power source voltage VDD and the ground voltage, but the present disclosure is not limited thereto. Also, some of the transistors PG1, PG2, PG3, for example, may be made up of a PMOS transistor, and the remaining transistors NG1, NG2, NG3, for example, may be made up of an NMOS transistor, but the present disclosure is not limited thereto.

Further, in this embodiment, the configuration of the second sub-circuit 120 is configured as illustrated in FIG. 3, using the transistors PG1, PG2, PG3 and the transistors NG1, NG2, NG3, but the present disclosure is not limited to this configuration. As long as a circuit performs the OR operation of the logic level of the input data D and the logic level of the node NET 3, and performs the NAND operation of the logic level of the output of the OR operation and the logic level of the node NET 1 to transmit the output values to the node NET 2, its detailed configuration may be variously modified as needed.

The second circuit 100 may include a transistor P1 gated to the inverted value of the logic level of the clock signal CLK to pull up the node NET 1, a transistor P2 which is connected in parallel to the transistor P1 and is gated to the inverted value of the logic level of the node NET 0 to pull up the node NET 1, a transistor N1 which is gated to the logic level of the node NET 0 to transmit the logic level of the node NET 1, a transistor N2 which is connected in series to the transistor N1 and is gated to the logic level of the node NET 2, and a transistor N3 which is connected in series to the transistor N2 and is gated to the logic level of the clock signal CLK to transmit the ground voltage.

At this time, the node NET 1 may be pre-charged, when the transistor P1 is turned on or the transistor P2 is turned on. That is, the node NET 1 may have a logic high level (a logic value '1'). In contrast, the node NET 1 may be discharged, when all the transistors N1 to N3 are turned on. That is, the node NET 2 may have a logic low level (a logic value '0').

For example, when the logic level of the clock signal CLK is a low level L or the logic level of the node NET 0 is a low level L, the node NET 1 may be pre-charged. Meanwhile, when the logic level of the clock signal CLK is a high level H, the logic level of the node NET 0 is a high level H, and the logic level of the node NET 2 is a high level H, the node NET 1 may be discharged. However, the present disclosure is not limited thereto.

In this embodiment, as illustrated, the transistors P1, P2, N1, N2, N3 may be connected in series or in parallel between the power source voltage VDD and the ground voltage, but the present disclosure is not limited thereto. Also, some of the transistors P1, P2, for example, are made up of a PMOS transistor, and the remaining transistors N1, N2, N3, for example, may be made up of an NMOS transistor, but the present disclosure is not limited thereto, and some other embodiments of the second circuit 100 will be described below.

The latch circuit 300 includes a latch transistor PL1 which is gated to the inverted value of the logic level of the node NET 0 to pull up the node NET 4, a latch transistor PL2 which is connected to the power source VDD at one side and is gated to the logic level of the node NET 4, a latch transistor PL3 which is connected in series to the latch transistor PL2 at one side, is connected to the node NET 4 at the other side and is gated to the inverted value of the logic level of the clock signal CLK, and an inverter I1 which inverts the logic level of the node NET 4 and transmits it to the output terminal OUT.

Further, the latch circuit 300 may further include a latch transistor NL1 which is connected between the node NET 3 and the node NET 4 and is gated to the logic level of the clock signal CLK, and a latch transistor NL2 which is connected in parallel to the latch transistor NL1 and is gated to the inverted value, inverted by inverter I2, of the logic level of the node NET 4.

In this embodiment, as illustrated, the transistors PL1, PL2, PL3, NL1, NL2 may be connected in series or in parallel between the power source voltage VDD and the node NET 3, but the present disclosure is not limited thereto. Also, some of the transistors PL1, PL2, PL3, for example, are made up of a PMOS transistor, and the remaining transistors NL1, NL2, for example, may be made up of an NMOS transistor, but the present disclosure it is not limited thereto.

Further, in this embodiment, the configuration of the latch circuit 300 is configured as illustrated in FIG. 1 using the transistors PL1, PL2, PL3 and the transistors NL1, NL2, but the present disclosure is not limited to such a configuration, and as long as a circuit is configured so that each time the clock signal CLK rises (e.g., a positive edge), the logic level of the node NET 0 is transmitted to the output terminal OUT, and the circuit value is maintained in the output terminal OUT in a section in which the clock signal CLK does not rise, its detailed configuration may be variously modified as needed.

The present disclosure is configured so that the first circuit 100 is used for operation of the flip-flop, some of the transistors included in the second sub-circuit 120 are shared by directly connecting the node NET 2 of the second sub-circuits 120 serving as an output terminal included in the first circuit 100 to the first sub-circuit 110, and a discharge path is integrated.

Thus, in the semiconductor circuit according to some embodiments of the present disclosure, the number of transistors to be used may be reduced, and the area required for forming the circuit may be reduced. Thus, the cost of manufacturing of the semiconductor circuit is reduced, and the efficiency of the use area may be increased. In addition, it is possible to achieve the low power consumption, while maintaining the performance of the flip-flop.

FIGS. 4 to 7 are timing charts for explaining the operation of the semiconductor circuit according to an embodiment of the present disclosure.

In the semiconductor circuit according to an embodiment of the present disclosure, the inverted value of the logic level of the input data D may be transmitted to the output terminal OUT each time the clock signal CLK rises. That is, the logic level of the output terminal OUT may be varied at a positive edge of the clock signal CLK. The value of the logic level of the output terminal OUT may be maintained at a section other than the positive edge the clock signal CLK. Consequently, when the clock signal CLK is at the high level H, the logic level of the output terminal OUT may have a value opposite to the logic level of the input data D. However, the present disclosure is not limited thereto.

Figure 4:
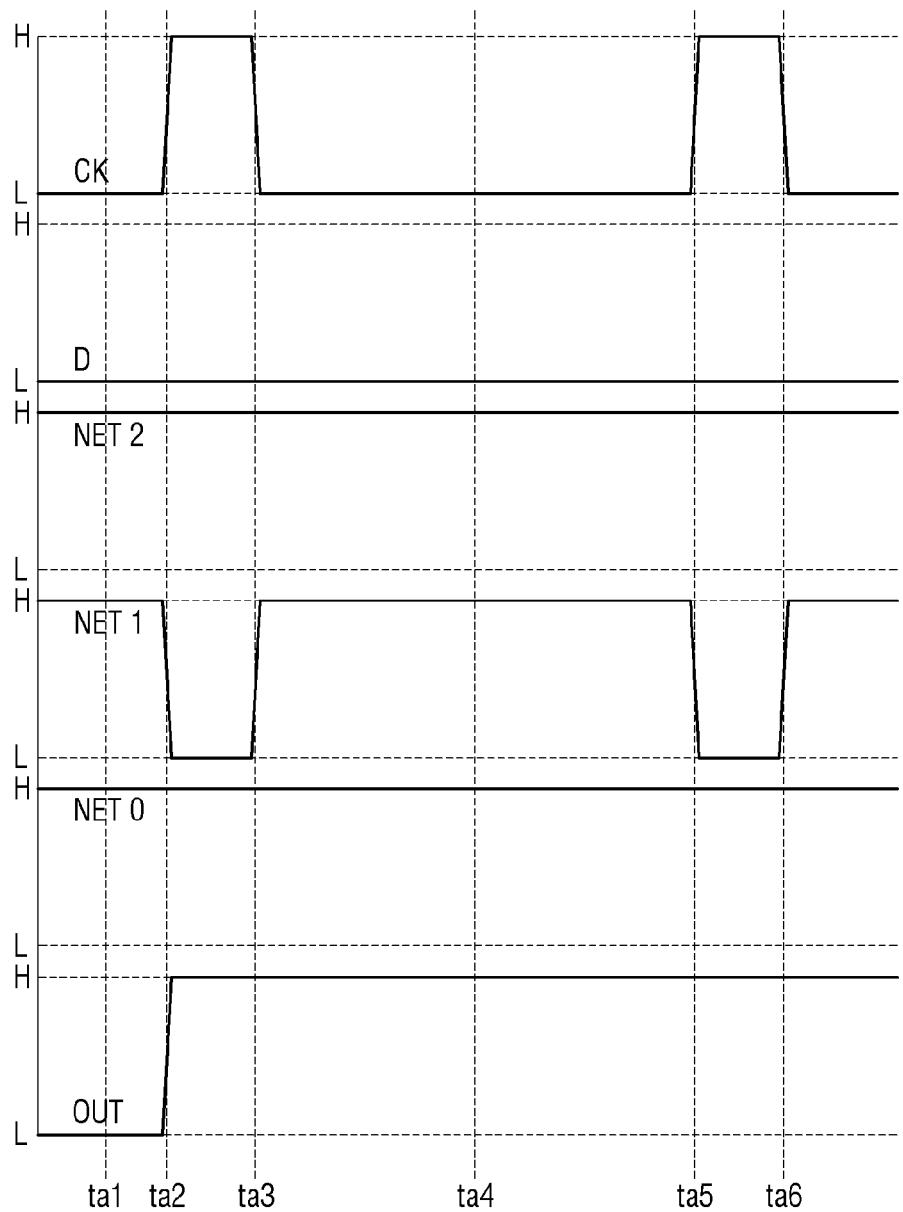
FIGS. 4 to 7 are timing charts for explaining the operation of the semiconductor circuit according to an embodiment of the present disclosure.

FIG. 4 is a timing chart for explaining the operation of the semiconductor circuit based on the case where the logic level of the input data D is the low level L.

Specifically, the operation of the circuit at a time ta1 will be described with reference to FIGS. 1 and 4. The logic level of the input data D is the low level L, and the logic level of the clock signal CLK is the low level L.

In the first sub-circuit 110, since the logic level of the clock signal CLK is the low level L, the transistor PE2 gated to the inverted value of the logic level of the clock signal CLK is turned on to pre-charge the node NET 0. At this time, the logic level of the node NET 0 may be at a high level H.

Thus, the transistor NE2 gated to the logic level of the node NET 0 is turned on to discharge the node NET 3. At this time, the logic level of the node NET 3 may become a low level L.

In the second circuit 100, since the logic level of the clock signal CLK is the low level L, the transistor P1 gated to the inverted value of the logic level of the clock signal CLK is turned on to pre-charge the node NET 1. At this time, the logic level of the node NET 1 may become a high level H.

In the second sub-circuit 120, the gate G5 performs the OR operation of the logic level of the input data D (low level L) and the logic level (low level L) of the node NET 3 and transmits the low level L to the gate G4.

The gate G4 performs the NAND operation of the logic level (low level L) of the output of the gate G5 and the logic level (high level H) of the node NET 1 and transmits an output value (high level H) to the node NET 2.

That is, in a state in which the logic level of the clock signal CLK is the low level, both the node NET 0 and the node NET 1 are pre-charged, and the node NET 3 is discharged. The value of the node NET 2 becomes a high level H. The node NET 4 of the latch circuit 300 is pre-charged, and the logic level of the output terminal OUT is maintained at a low level L.

Subsequently, at a time ta2, the logic level of the clock signal CLK rises from the low level L to the high level H. Thus, the transistor NE1 is turned on, and the logic level of the node NET 2 may be transmitted to the node NET 0. That is, in other words, the logic levels of the node NET 2 and the node NET 0 may be the same.

Thus, as the transistor P1 of the second circuit 100 is turned off and the transistors N1, N2, N3 are turned on, the node NET 1 may be discharged. That is, the node NET 1 is discharged when the logic level of the clock signal CLK is the high level H, and it may have a low level L.

In the latch circuit 300, as the logic level of the clock signal CLK becomes a high level H, the transistor NL1 is turned on, and the logic level (low level L) of the node NET 3 is transmitted to the node NET 4. Therefore, the logic level of the output terminal OUT is determined as the high level H which is the inverted value of the logic level of the node NET 4.

Subsequently, at a time ta3, the logic level of the clock signal CLK is converted from the high level H into the low level L. Thus, the node NET 1 is pre-charged again. However, regardless of the pre-charge of the node NET 1, the constant value of the node NET 0 is maintained, and the logic level of the output terminal OUT maintains the same value.

Subsequently, since there is no change in the signal at a time ta4, the constant value is maintained, and each node may have the same value as the time ta1.

Subsequently, the semiconductor circuit may be operated at a time ta5 in the same manner as in the time ta2 and the semiconductor circuit may be operated at a time ta6 in the same manner as in the time ta3.

Consequently, in the semiconductor circuit of the present disclosure, each time the clock signal CLK rises (e.g., when changing from the low level L to the high level H), the logic level of the node NET 2 becomes the same as the logic level of the node NET 0, and the logic level of the node NET 0 may be transmitted to the output terminal OUT. Further, in a section in which the clock signal CLK does not rise, the value of the output terminal OUT may be maintained.

Furthermore, the logic level of the input data D has a value different from the logic level of the node NET 2. In a section in which the clock signal CLK is at a high level H, the logic level of the node NET 1 has a value different from the logic level of the node NET 0. However, the present disclosure is not limited thereto.

Figure 5:
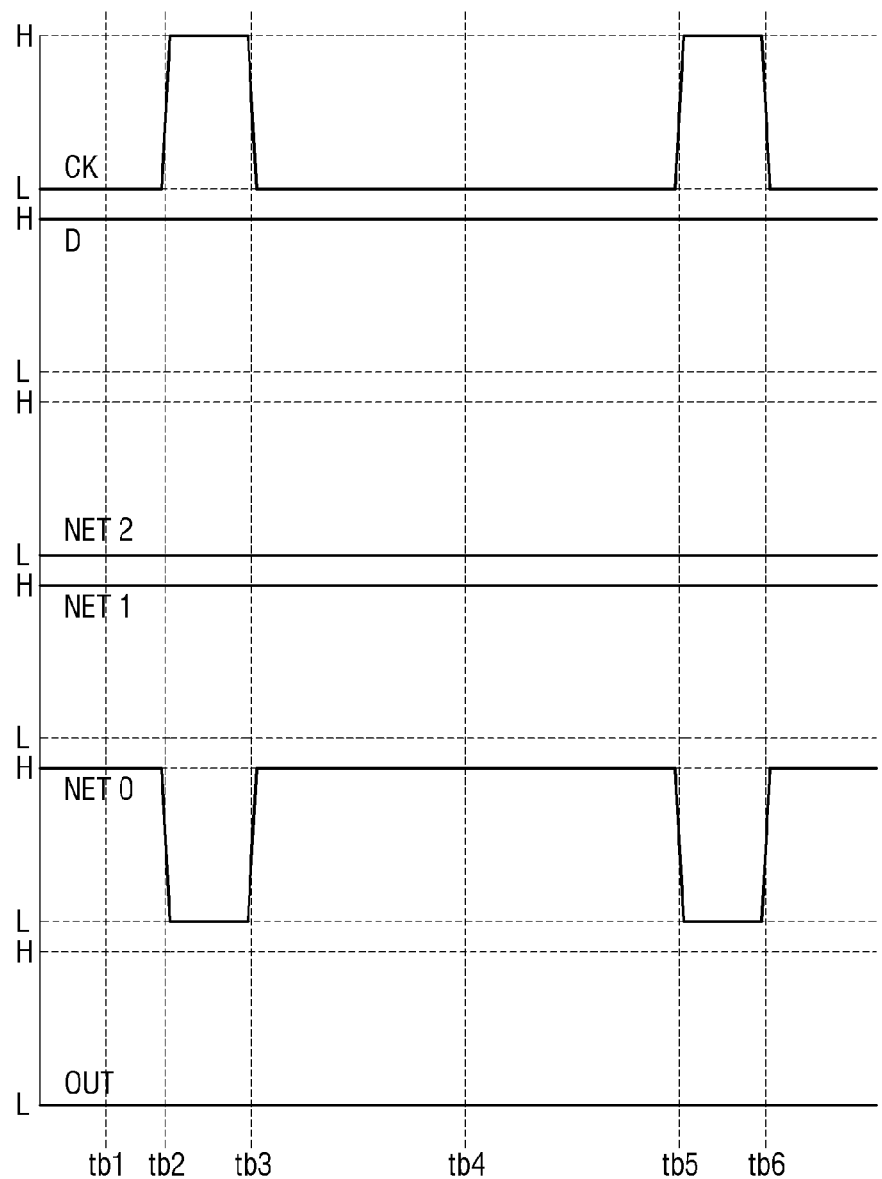

FIG. 5 is a timing chart for explaining the operation of the semiconductor circuit, on the basis of a case where the logic level of the input data D is the high level H. For convenience of description, the repeated description of the same matters as the contents described with reference to FIG. 4 will be omitted and the differences will be mainly described.

Referring to FIGS. 1 and 5, at a time tb1, the logic level of the input data D is the high level H, and the logic level of the clock signal CLK is the low level L.

In the first sub-circuit 110, since the logic level of the clock signal CLK is the low level L, the transistor PE2 gated to the inverted value of the logic level of the clock signal CLK is turned on to pre-charge the node NET 0. Similarly, the transistor P1 gated to the inverted value of the logic level of the clock signal CLK is turned on to pre-charge the node NET 1. At this time, all of the logic levels of the node NET 0 and the node NET 1 may become a high level H.

Thus, the transistor NE2 gated to the logic level of the node NET 0 is turned on to discharge the node NET 3. At this time, the logic level of the node NET 3 may become a low level L.

At this time, in the second sub-circuit 120, the gate G5 performs the OR operation of the logic level (high level H) of the input data D and the logic level (low level L) of the node NET 3 and transmits the high level H to the gate G4.

The gate G4 performs the NAND operation of the logic level (high level H) of the output of the gate G5, and the logic level (high level H) of the node NET 1, and transmits the output value (low level L) to the node NET 2.

That is, when the logic level of the input data D is the high level H, the logic level the node NET 2 has a value opposite to the logic level of the node NET 1.

Subsequently, at a time tb2, the logic level of the clock signal CLK rises from the low level L to the high level H. Thus, the transistor NE1 is turned on, and the logic level (low level L) of the node NET 2 may be transmitted to the node NET 0.

At this time, in the second sub-circuit 120, the transistor NG1 gated to the logic level of the input data D, and the transistor NG3 gated to the node NET 1 are turned on, and the node NET 2 may be discharged.

Therefore, the logic level of the node NET 0 is discharged by the second sub-circuit 120 and may become a low level L. The node NET 1 may be maintained at the high level H by turning-on of the transistor P1.

In the latch circuit 300, as the logic level of the clock signal CLK becomes a high level H, the transistor NL1 is turned on, and the logic level (high level H) of the node NET 3 is transmitted to the node NET 4. Therefore, the logic level of the output terminal OUT is determined as a low level L which is an inverted value of the logic level of the node NET 4.

Subsequently, at a time tb3, the logic level of the clock signal CLK is converted from the high level H into the low level L. Thus, the transistor PE2 is turned on, the transistor NE1 is turned off, and the node NET 0 is pre-charged again. The logic level of the output terminal OUT is maintained at the same value.

Subsequently, since there is no change in the signal at the time tb4, the constant value is maintained, and each node may have the same value as the time tb1.

Subsequently, the semiconductor circuit may be operated at the time tb5 in the same manner as the time tb2 and the semiconductor circuit may be operated at the time tb6 in the same manner as the time tb3.

Figure 6:
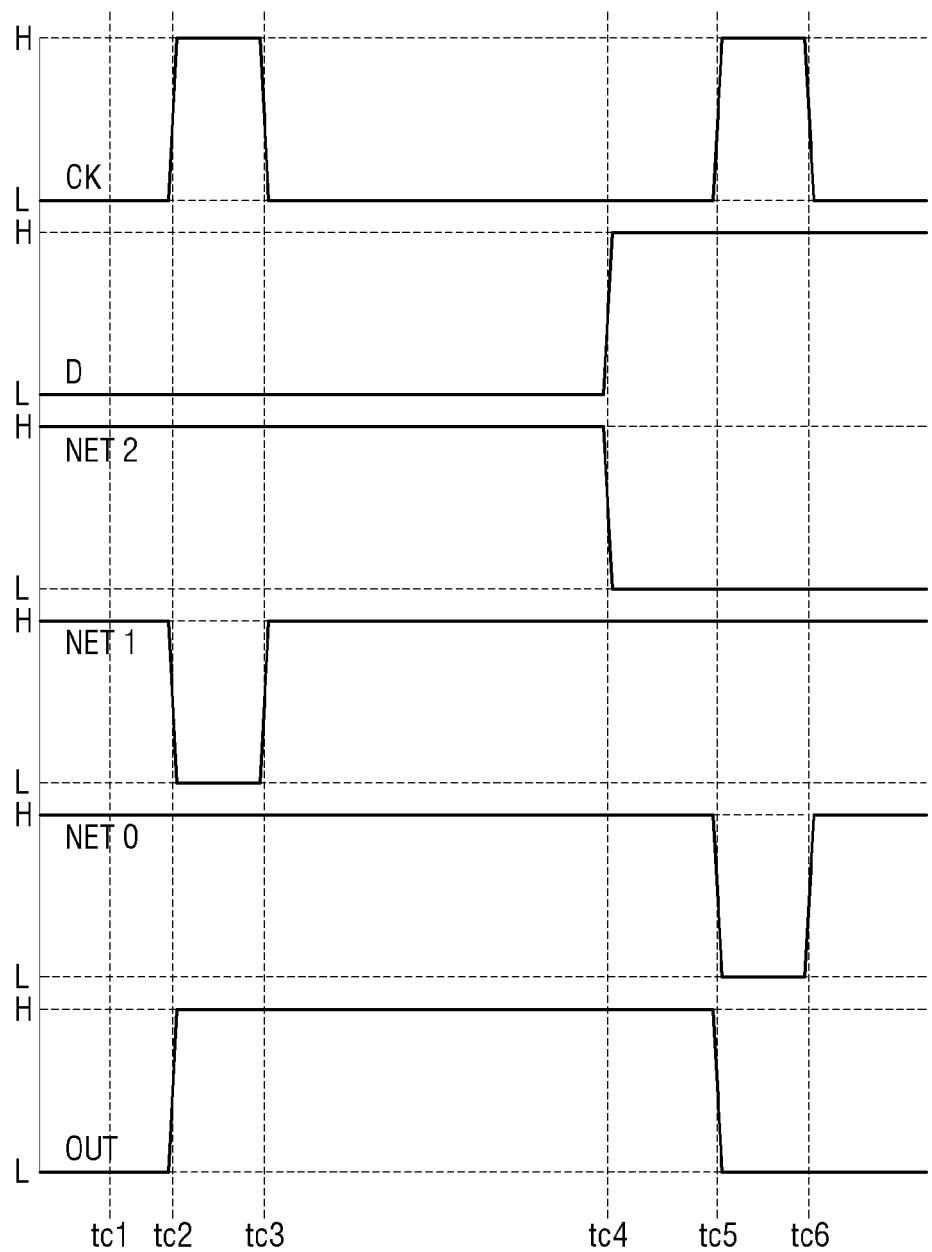

FIG. 6 is a timing chart for explaining the operation of the semiconductor circuit based on a case where the logic level of the input data D rises from the low level L to the high level H. For convenience of explanation, hereinafter, the same matters as the contents described above are not described, and the differences will be mainly described.

Referring to FIGS. 1 and 6, the operation of the semiconductor circuit at the times tc1, tc2, tc3 may be substantially the same as the operation at the times ta1, ta2, ta3 described referring to FIG. 4.

That is, at the time tc2, the logic level of the clock signal CLK rises from the low level L to the high level H. The transistor NE1 is turned on, the logic level of the node NET 2 may be transmitted to the node NET 0. That is, in other words, the logic levels of the node NET 2 and the node NET 0 become identical to each other.

Thus, as the transistor P1 of the second circuit 100 is turned off and the transistors N1, N2, N3 are turned on, the node NET 1 may be discharged. That is, the node NET 1 is discharged while the logic level of the clock signal CLK is the high level H, and it may have a low level L.

In the latch circuit 300, as the logic level of the clock signal CLK becomes a high level H, the transistor NL1 is turned on, and the logic level (low level L) of the node NET 3 is transmitted to the node NET 4. Therefore, the logic level of the output terminal OUT is determined as the high level H which is the inverted value of the logic level of the node NET 4.

Subsequently, at the time tc3, the logic level of the clock signal CLK is converted from the high level H into the low level L. Accordingly, the transistor P1 is turned on, the transistor N3 is turned off, and the node NET 1 is pre-charged again.

However, at the time tc4, the logic level of the input data D may be converted from the low level L into the high level H.

At this time, the transistor NE2 gated to the logic level of the node NET 0 is turned on to discharge the node NET 3. At this time, the logic level of the node NET 3 becomes a low level L.

At this time, in the second sub-circuit 120, the gate G5 performs the OR operation of the logic level (high level H) of the input data D and the logic level (low level L) of the node NET 3 and transmits the high level H to the gate G4. The gate G4 performs the NAND operation of the logic level (high level H) of the output of the gate G5, and the logic level (high level H) of the node NET 1, and transmits the output value (low level L) to the node NET 2. That is, as the logic level of the input data D is converted into the high level H, the logic level of the node NET 2 is converted into the low level L. However, since the logic level of the clock signal CLK does not change, the logic level of the node NET 2 is not transmitted to the output terminal OUT.

Subsequently, at the time tc5, as the logic level of the clock signal CLK rises from the low level L to the high level H, the transistor NE1 is turned on, and the logic level (low level L) of the node NET 2 may be transmitted to the node NET 0.

At this time, in the second sub-circuit 120, the transistor NG1 gated to the logic level of the input data D, and the transistor NG3 gated to the node NET 1 are turned on, and the node NET 2 may be discharged.

Therefore, the logic level of the node NET 0 is discharged by the second sub-circuit 120 and may become a low level L. The node NET 1 may be maintained at a high level H, by turning-on of the transistor P1.

In the latch circuit 300, as the logic level of the clock signal CLK becomes a high level H, the transistor NL1 is turned on, and the logic level (high level H) of the node NET 3 is transmitted to the node NET 4. Therefore, the logic level of the output terminal OUT is determined as the low level L which is the inverted value of the logic level of the node NET 4.

Subsequently, at the time tc6, the logic level of the clock signal CLK is converted from the high level H into the low level L. Thus, the transistor PE1 is turned on, the transistor NE1 is turned off, and the node NET 0 is pre-charged again. The logic level of the output terminal OUT is maintained at the same value.

Figure 7:
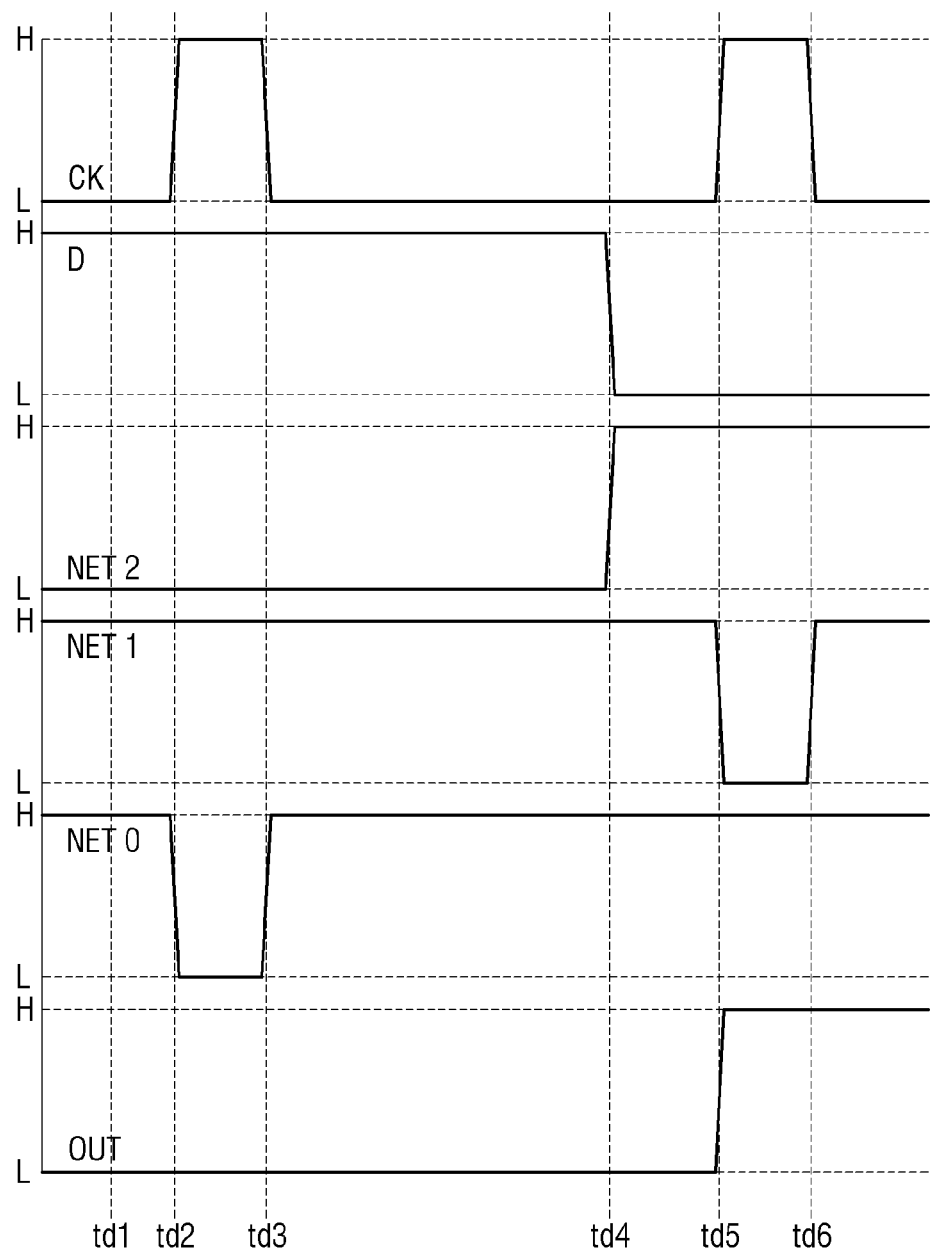

FIG. 7 is a timing chart for explaining the operation of the semiconductor circuit based on the case where the logic level of the input data D is converted from the high level H into the low level L. For convenience of explanation, hereinafter, the repeated description of the same matters as the contents described above are not described, and the differences will be mainly described.

Referring to FIGS. 1 and 7, the operation of the semiconductor circuit at the times td1, td2, td3 are substantially the same as the operation at the times tb1, tb2, tb3 described referring to FIG. 5.

That is, at the time td2, as the logic level of the clock signal CLK rises from the low level L to the high level H, the transistor NE1 is turned on, and the logic level (low level L) of the node NET 2 may be transmitted to the node NET 0.

At this time, in the second sub-circuit 120, the transistor NG1 gated to the logic level of the input data D, and the transistor NG3 gated to the node NET 1 are turned on, and the node NET 2 may be discharged.

Therefore, the logic level of the node NET 0 is discharged by the second sub-circuit 120 and may become a low level L. The node NET 1 may be maintained at a high level H by turning-on of the transistor P1.

In the latch circuit 300, as the logic level of the clock signal CLK becomes a high level H, the transistor NL1 is turned on, and the logic level (high level H) of the node NET 3 is transmitted to the node NET 4. Therefore, the logic level of the output terminal OUT is determined as the low level L which is an inverted value of the logic level of the node NET 4.

Subsequently, at the time td3, the logic level of the clock signal CLK is converted from the high level H into the low level L. Thus, the transistor PE1 is turned on, the transistor NE1 is turned off, and the node NET 0 is pre-charged again. The logic level of the output terminal OUT is maintained at the same value.

However, at the time td4, the logic level of the input data D may be converted from the high level H into the low level L.

The transistor NE2 gated to the logic level of the node NET 0 is turned on to discharge the node NET 3. At this time, the logic level of the node NET 3 becomes a low level L.

Next, in the second sub-circuit 120, the gate G5 performs the OR operation of the logic level (low level L) of the input data D, and the logic level (low level L) of the node NET 3, and transmits the low level L to the gate G4. The gate G4 performs the NAND operation of the logic level (low level L) of the output of the gate G5, and the logic level (high level H) of the node NET 1, and transmits the output value (high level H) to the node NET 2. That is, as the logic level of the input data D is converted into the low level L, the logic level of the node NET 2 is converted into the high level H. However, since the logic level of the clock signal CLK does not change, the logic level of the node NET 2 is not transmitted to the output terminal OUT.

Subsequently, at the time td5, the logic level of the clock signal CLK rises from the low level L to the high level H. The transistor NE1 is turned on, and the logic level of the node NET 2 may be transmitted to the node NET 0. That is, in other words, the logic levels of the node NET 2 and the node NET 0 become identical to each other.

Thus, as the transistor P1 of the second circuit 100 is turned off, and the transistors N1, N2, N3 are turned on, the node NET 1 may be discharged. That is, the node NET 1 is discharged while the logic level of the clock signal CLK is the high level H, and it may have a low level L.

In the latch circuit 300, as the logic level of the clock signal CLK becomes a high level H, the transistor NL1 is turned on, and the logic level (low level L) of the node NET 3 is transmitted to the node NET 4. Therefore, the logic level of the output terminal OUT is determined as the high level H which is the inverted value of the logic level of the node NET 4.

Subsequently, at the time td6, the logic level of the clock signal CLK is converted from the high level H into the low level L. Accordingly, the transistor P1 is turned on, the transistor N1 is turned off, and the node NET 1 is pre-charged again.

Figure 8:
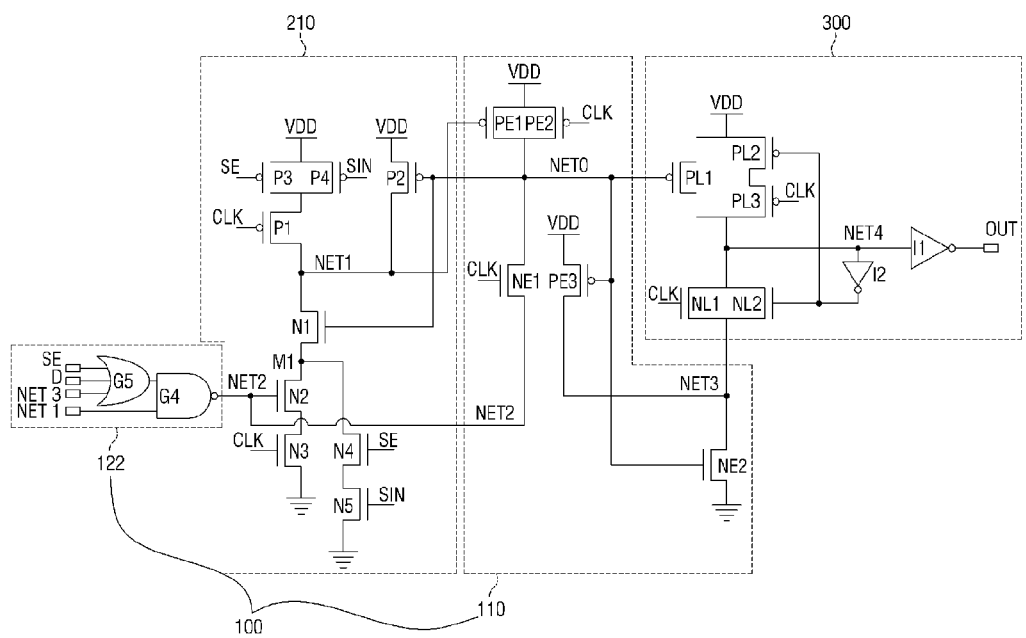
FIG. 8 is a circuit diagram illustrating a semiconductor circuit according to another embodiment of the present disclosure.

FIG. 8 is a circuit diagram illustrating a semiconductor circuit according to another embodiment of the present disclosure. For convenience of explanation, hereinafter, the same matters as the contents described above are not described, and the differences will be mainly described.

Referring to FIG. 8, a semiconductor circuit according to another embodiment of the present disclosure includes a first circuit 100, a second circuit 210 and a latch circuit 300. The first circuit 100 includes a first sub-circuit 110 and a second sub-circuit 122. The semiconductor circuit according to another embodiment of the present disclosure may include substantially the same structure as the semiconductor circuit described above with reference to FIGS. 1 to 3.

However, in the semiconductor circuit according to another embodiment of the present disclosure, the second sub-circuit 122 and the second circuit 210 further include a transistor to which a scan enable signal SE and a scan input signal SIN are additionally input.

Specifically, the second sub-circuit 122 may include the gate G5 and the gate G4. The gate G5 may perform the OR operation of the logic level of the input data D, the logic level of the node NET 3, and the logic level of the scan enable signal SE. The gate G4 performs the NAND operation of the logic level of the output of the gate G5 and the logic level of the node NET 1, and may transmit the output values to the node NET 2.

The second circuit 210 may include a transistor P3 which is connected in series to the transistor P1 and is gated to the inverted value of the logic level of the scan enable signal SE, and a transistor P4 which is connected in parallel to the transistor P3 and is gated to the inverted value of the logic level of the scan input signal SIN.

Furthermore, the second circuit 210 may further include a transistor N4 which is connected to one end M1 of the transistor N1 and is gated to the logic level of the scan enable signal SE, and a transistor N5 which is connected in series to the transistor N4 and is gated to the logic level of the scan input signal SIN.

Figure 9:
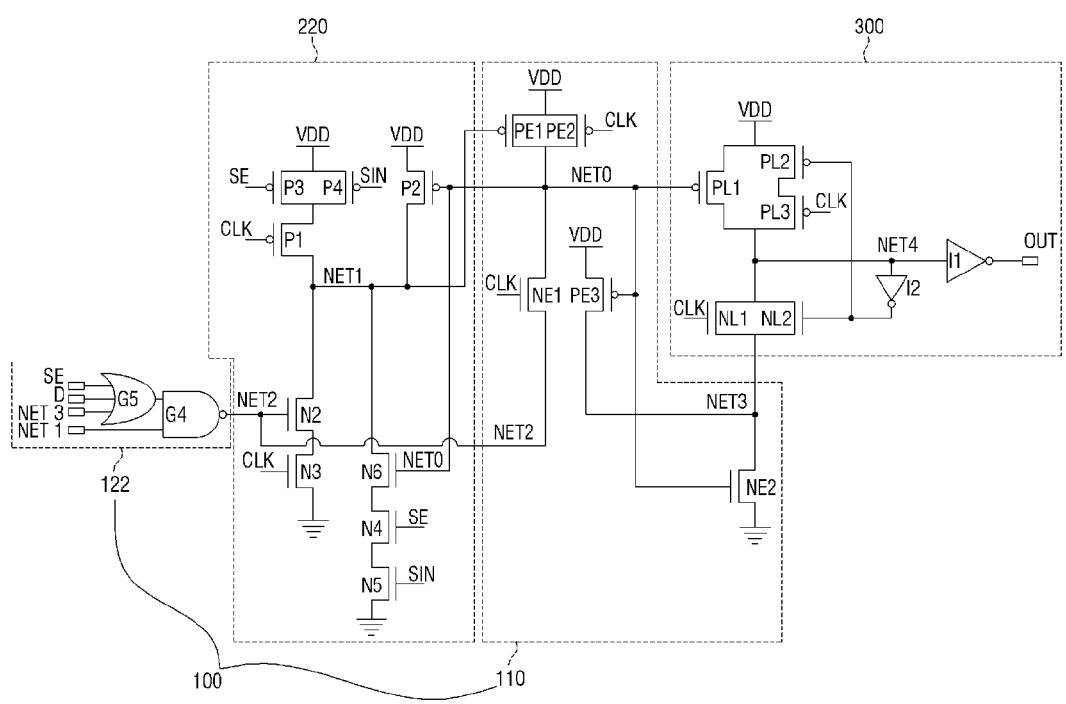
FIG. 9 is a circuit diagram illustrating a semiconductor circuit according to still another embodiment of the present disclosure.

FIG. 9 is a circuit diagram illustrating a semiconductor circuit according to still another embodiment of the present disclosure. For convenience of explanation, hereinafter, the same matters as the contents described above referring to FIG. 8 are not described, and the differences will be mainly described.

Referring to FIG. 9, a semiconductor circuit according to still another embodiment of the present disclosure includes a first circuit 100, a second circuit 220 and a latch circuit 300. The first circuit 100 includes a first sub-circuit 110 and a second sub-circuit 122. The semiconductor circuit according to still another embodiment of the present disclosure may include substantially the same structure as the semiconductor circuit described above with reference to FIG. 8.

However, the second circuit 220 of the semiconductor circuit according to still another embodiment of the present disclosure may include a transistor N6 rather than the transistor N1.

Specifically, the second circuit 220 may further include a transistor N6 which is connected to the node NET 1 at one end and is gated to the logic level of the node NET 0, a transistor N4 which is connected in series to the transistor N6 and is gated to the logic level of the scan enable signal SE, and a transistor N5 which is connected in series to the transistor N4 and is gated to the logic level of the scan input signal SIN.

The semiconductor circuit according to some embodiments of the present disclosure described referring to FIGS. 8 and 9 is configured so that the first circuit 100 is used for operation of the flip-flop, and by directly connecting the node NET 2 serving as the output terminal of the second sub-circuit 122 included in the first circuit 100 to the first sub-circuit 110, some transistors included in the second sub-circuits 120 are shared, and the discharge path is integrated. Thus, in the semiconductor circuit according to some embodiments of the present disclosure, the number of the used transistors is reduced, and the area required for forming the circuit may be reduced. Thus, the cost of manufacturing of the semiconductor circuit is reduced, and the efficiency of the use area may be increased. In addition, it is possible to achieve the low power consumption, while maintaining the performance of the flip-flop.

Figure 10:
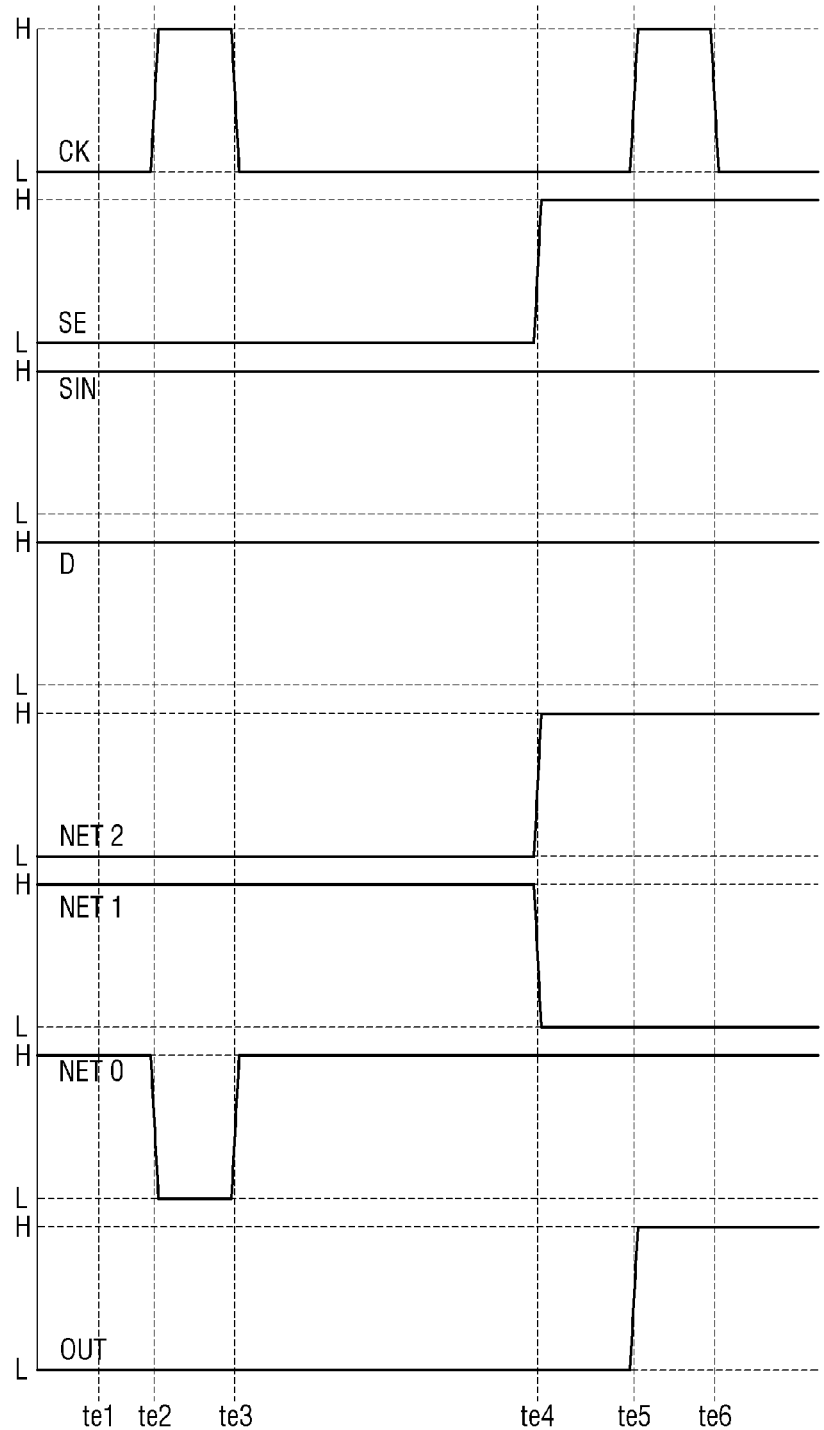
FIGS. 10 and 11 are timing charts for explaining the operation of the semiconductor circuit according to some embodiments of the present disclosure.
Figure 11:
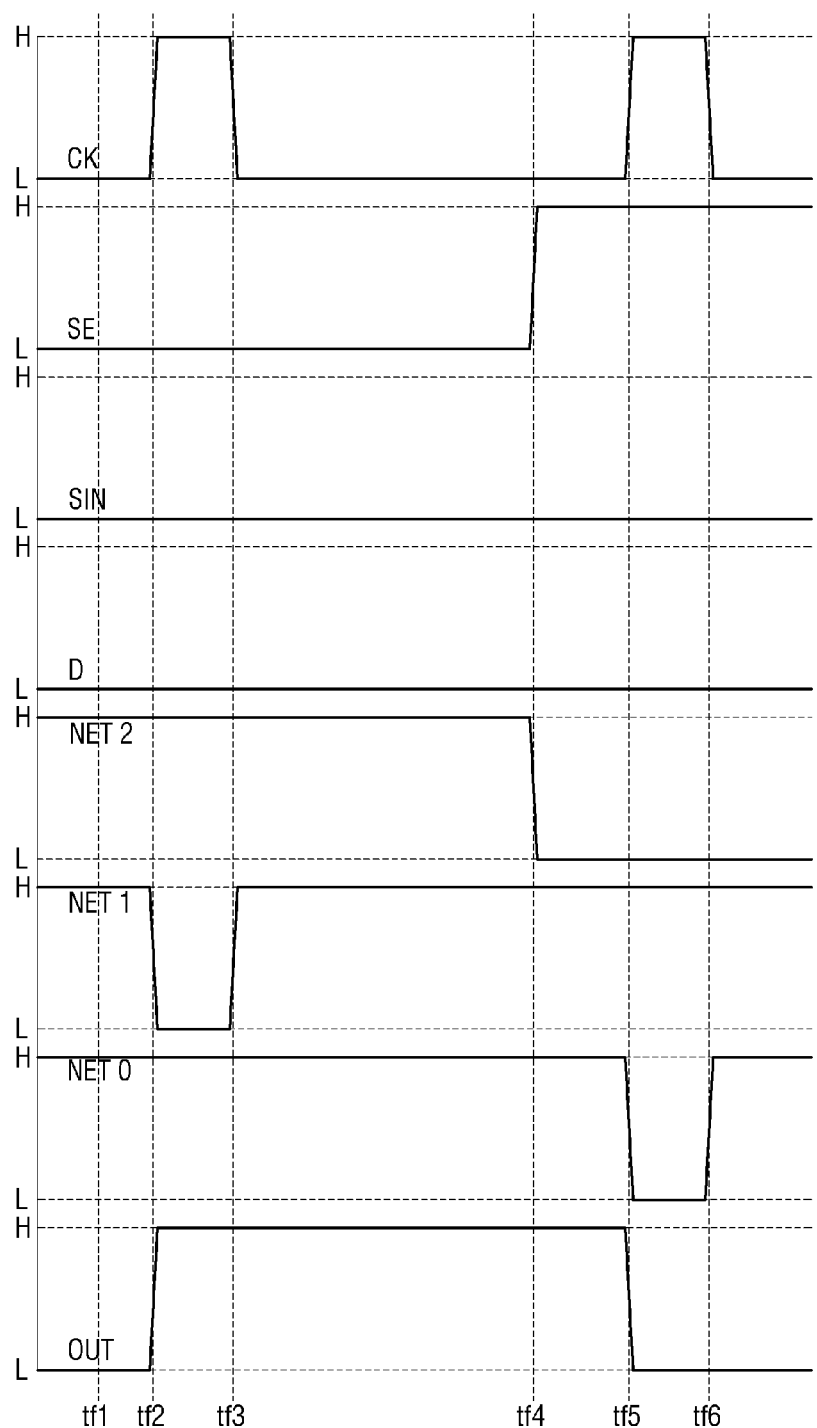

FIGS. 10 and 11 are timing charts for explaining the operation of the semiconductor circuit according to some embodiments of the present disclosure. Hereinafter, the same matters as in the embodiments described above are not described, and the differences will be mainly described.

The semiconductor circuit according to some embodiments of the present disclosure may be operated in the substantially same manner as the semiconductor circuit described referring to FIGS. 4 to 7, when the scan enable signal SE is non-activated (low level L).

However, when the scan enable signal SE is activated (high level H), in the semiconductor circuit, the logic level of the output terminal OUT may change by the scan input signal SIN instead of the input data D.

FIG. 10 is a timing chart for explaining the operation of the semiconductor circuit based on the case where the logic level of the scan input signal SIN is the high level H.

Specifically, referring to FIG. 10, in the case of the times te1, te2, te3, they may be substantially the same as the operation of the semiconductor circuit at the times tb1, tb2, tb3 described referring to FIG. 5.

However, at the time te4, the logic level of the scan enable signal SE is the high level H. At this time, the node NET 1 may be pre-charged when all the transistors P1, P4 are turned on. That is, the node NET 1 is pre-charged only when all of the logic levels of the scan input signal SIN and the logic level of the clock signal CLK are the low levels L.

That is, when the logic level of the scan enable signal SE is the high level H, the node NET 1 is pre-charged when all of the logic levels of the scan input signal SIN and the logic level of the clock signal CLK are the low level L. Moreover, when the logic level of the scan enable signal SE is the low level L, regardless of the logic level of the scan input signal SIN, the node NET 1 is pre-charged when the logic level of the clock signal CLK is the low level L.

In the second sub-circuit 122, since the gate G5 performs the OR operation of the logic level (high level H) of the scan enable signal SE, the logic level of the input data D and the logic level of the node NET 3, it transmits the high level H to the gate G4. The gate G4 performs the NAND operation of the logic level (high level H) of the output of the gate G5, and the logic level of the node NET 1, and transmits the output values to the node NET 2. That is, the logic level of the node NET 2 becomes opposite to the logic level of the node NET 1.

As the transistor P4 gated by the inverted value of the logic level of the scan input signal SIN is non-activated, the node NET 1 is not pre-charged, and as the transistors N1, N4, N5 are turned on, the node NET 1 is discharged. Therefore, the node NET 1 has a logic level of the low level L, and the node NET 2 has a logic level of the high level H. However, since the logic level of the clock signal CLK does not change, the logic level of the node NET 2 is not transmitted to the output terminal OUT.

Subsequently, at the time te5, as the logic level of the clock signal CLK rises from the low level L to the high level H, the transistor NE1 is turned on, the logic level (high level H) of the node NET 2 may be transmitted to the node NET 0. In addition, the logic level of the node NET 3 becomes a low level L which is the inverted value of the logic level of the node NET 0.

In the latch circuit 300, as the logic level of the clock signal CLK becomes a high level H, the transistor NL1 is turned on, the logic level (low level L) of the node NET 3 is transmitted to the node NET 4. Therefore, the logic level of the output terminal OUT is determined as the high level H which is the inverted value of the logic level of the node NET 4.

Subsequently, at the time te6, the logic level of the clock signal CLK is converted from the high level H into the low level L. At this time, the logic level of the output terminal OUT is maintained at the same value.

FIG. 11 is a timing chart for explaining the operation of the semiconductor circuit, based on the case where the logic level of the scan input signal SIN is the low level L.

Specifically, referring to FIG. 11, in the case of the times tf1, tf2, tf3, they may be substantially the same as the operation of the semiconductor circuit at the times ta1, ta2, ta3 described referring to FIG. 4.

However, at the time tf4, the logic level of the scan enable signal SE is the high level H. At this time, the node NET 1 may be pre-charged when the transistors P1 and P4 are turned on.

In the second sub-circuit 122, since the gate G5 performs the OR operation of the logic level (high level H) of the scan enable signal SE, the logic level of the input data D and the logic level of the node NET, it transmits the high level H to the gate G4. The gate G4 performs the NAND operation of the logic level (high level H) of the output of the gate G5 and the logic level of the node NET 1, and transmits the output value to the node NET 2. That is, the logic level of the node NET 2 becomes opposite to the logic level of the node NET 1.

As the transistor P1 gated by the inverted value of the logic level of the clock signal CLK is activated, the node NET 1 is pre-charged. Therefore, the node NET 1 has a logic level of the high level H, and the node NET 2 has a logic level of the low level L. However, since the logic level of the clock signal CLK does not change, the logic level of the node NET 2 is not transmitted to the output terminal OUT.

Subsequently, at the time tf5, as the logic level of the clock signal CLK rises from the low level L to the high level H, the transistor NE1 is turned on, and the logic level (low level L) of the node NET 2 may be transmitted to the node NET 0. In addition, the logic level of the node NET 3 becomes a high level H which is the inverted value of the logic level of the node NET 0.

In the latch circuit 300, as the logic level of the clock signal CLK becomes a high level H, the transistor NL1 is turned on, and the logic level (high level H) of the node NET 3 is transmitted to the node NET 4. Therefore, the logic level of the output terminal OUT is determined as the low level L which is the inverted value of the logic level of the node NET 4.

Subsequently, at the time tf6, the logic level of the clock signal CLK is converted from the high level H to the low level L. At this time, the logic level of the output terminal OUT is maintained at the same value.

Consequently, in another semiconductor circuit of the present disclosure, each time the clock signal CLK rises (e.g., when changing from the low level L to the high level H), the logic level of the node NET 2 becomes the same as the logic level of the node NET 0, and the logic level of the node NET 0 may be transmitted to the output terminal OUT. Further, in a section in which the clock signal CLK does not rise, the value of the output terminal OUT may be maintained.

However, when the scan enable signal SE is activated, the semiconductor circuit may be operated in a test mode for the scanning operation, and the output value of the output terminal OUT may change, based on the scan input signal SIN in place of the input data D. For example, when the scan input signal SIN is at a low level L, at a positive edge of the clock signal CLK, the logic level of the output terminal OUT may be converted from the high level H to the low level L. However, the present disclosure is not limited thereto, and when the scan input signal SIN is at a low level L, at a positive edge of the clock signal CLK, the logic level of the output terminal OUT may be converted from the low level L to the high level H.

Figure 12:
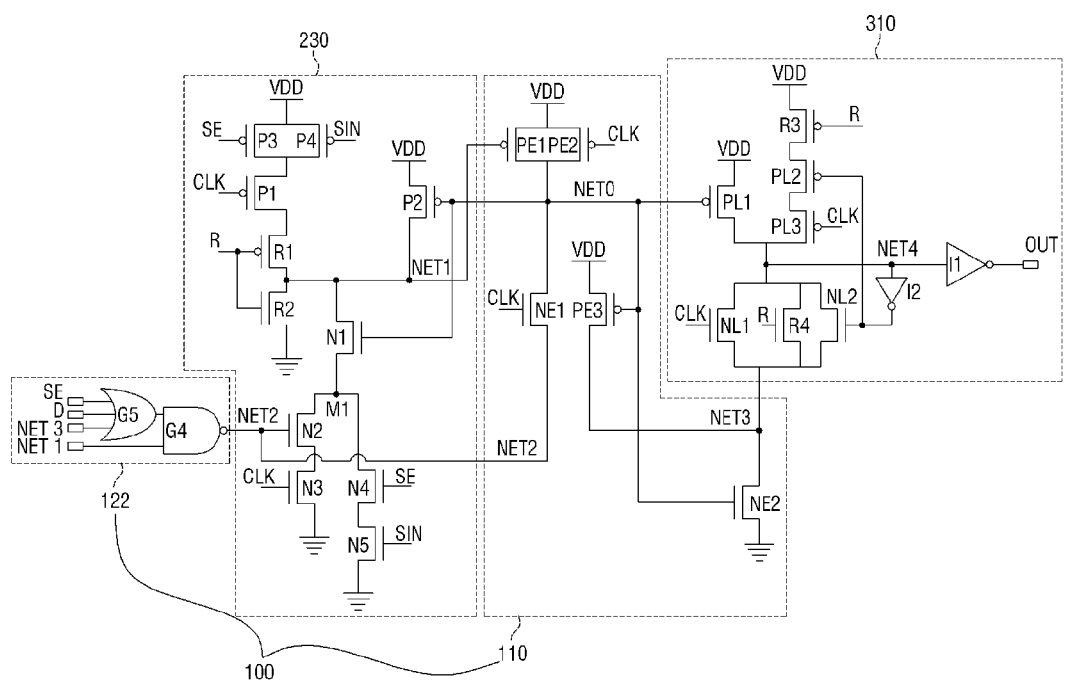
FIG. 12 is a circuit diagram illustrating a semiconductor circuit according to still another embodiment of the present disclosure.

FIG. 12 is a circuit diagram illustrating a semiconductor circuit according to still another embodiment of the present disclosure. For convenience of explanation, hereinafter, the same matters as the contents described above with reference to FIG. 8 are not described, and the differences will be mainly described.

Referring to FIG. 12, the semiconductor circuit according to still another embodiment of the present disclosure includes a first circuit 100, a second circuit 230 and a latch circuit 310. The first circuit 100 includes a first sub-circuit 110 and a second sub-circuit 122. The semiconductor circuit according to still another embodiment of the present disclosure may include the substantially same structure as the semiconductor circuit described above with reference to FIG. 8.

However, in the semiconductor circuit according to still another embodiment of the present disclosure, the second circuit 230 and the latch circuit 310 further includes a transistor to which a reset signal R is additionally input.

Specifically, the second circuit 230 may further include a reset transistor R1 which is connected between the transistor P1 and the node NET 1 and is gated to the inverted value of the logic level of the reset signal R, and a reset transistor R2 which is connected between the node NET 1 and ground and is gated to the logic level of the reset signal R.

Further, the latch circuit 310 may further include a reset transistor R3 which is connected between the power source VDD and the latch transistor PL2 and is gated to the inverted value of the logic level of the reset signal R, and a reset transistor R4 which is connected in parallel to the latch transistor NL1 and is gated to the logic level of the reset signal R to discharge the node NET 4.

Figure 13:
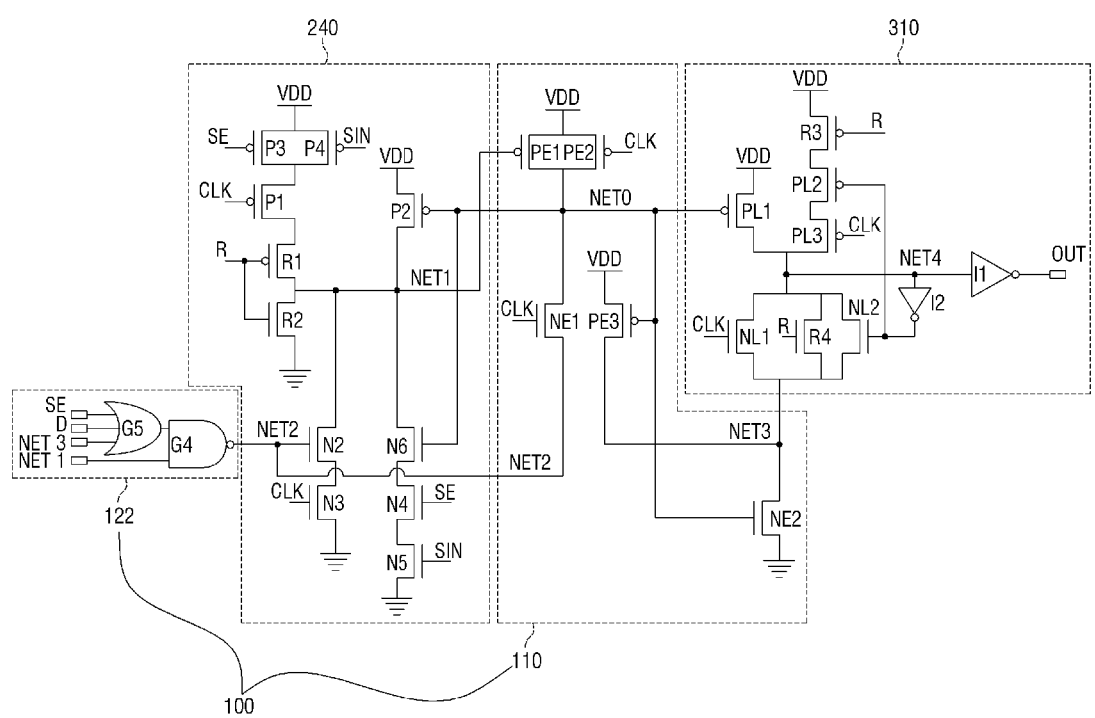
FIG. 13 is a circuit diagram illustrating a semiconductor circuit according to still another embodiment of the present disclosure.

FIG. 13 is a circuit diagram illustrating a semiconductor circuit according to still another embodiment of the present disclosure. For convenience of explanation, hereinafter, the same matters as in the embodiment described above referring to FIG. 9 are not described, and the differences will be mainly described.

Referring to FIG. 13, a semiconductor circuit according to still another embodiment of the present disclosure includes a first circuit 100, a second circuit 240 and a latch circuit 310. The semiconductor circuit according to still another embodiment of the present disclosure may include substantially the same structure as the semiconductor circuit described with reference to FIG. 9.

However, in the semiconductor circuit according to still another embodiment of the present disclosure, the second circuit 230 and the latch circuit 310 further include a transistor to which a reset signal R is additionally input.

Specifically, the second circuit 240 may further include a reset transistor R1 which is connected between the transistor P1 and the node NET 1 and is gated to the inverted value of the logic level of the reset signal R, and a reset transistor R2 which is connected between the node NET 1 and ground and is gated to the logic level of the reset signal R.

Further, the latch circuit 310 may further include a reset transistor R3 which is connected between the power source VDD and the latch transistor PL2 and is gated to the inverted value of the logic level of the reset signal R, and a reset transistor R4 which is connected in parallel to the latch transistor NL1 and is gated to the logic level of the reset signal R to discharge the node NET 4.

Figure 14:
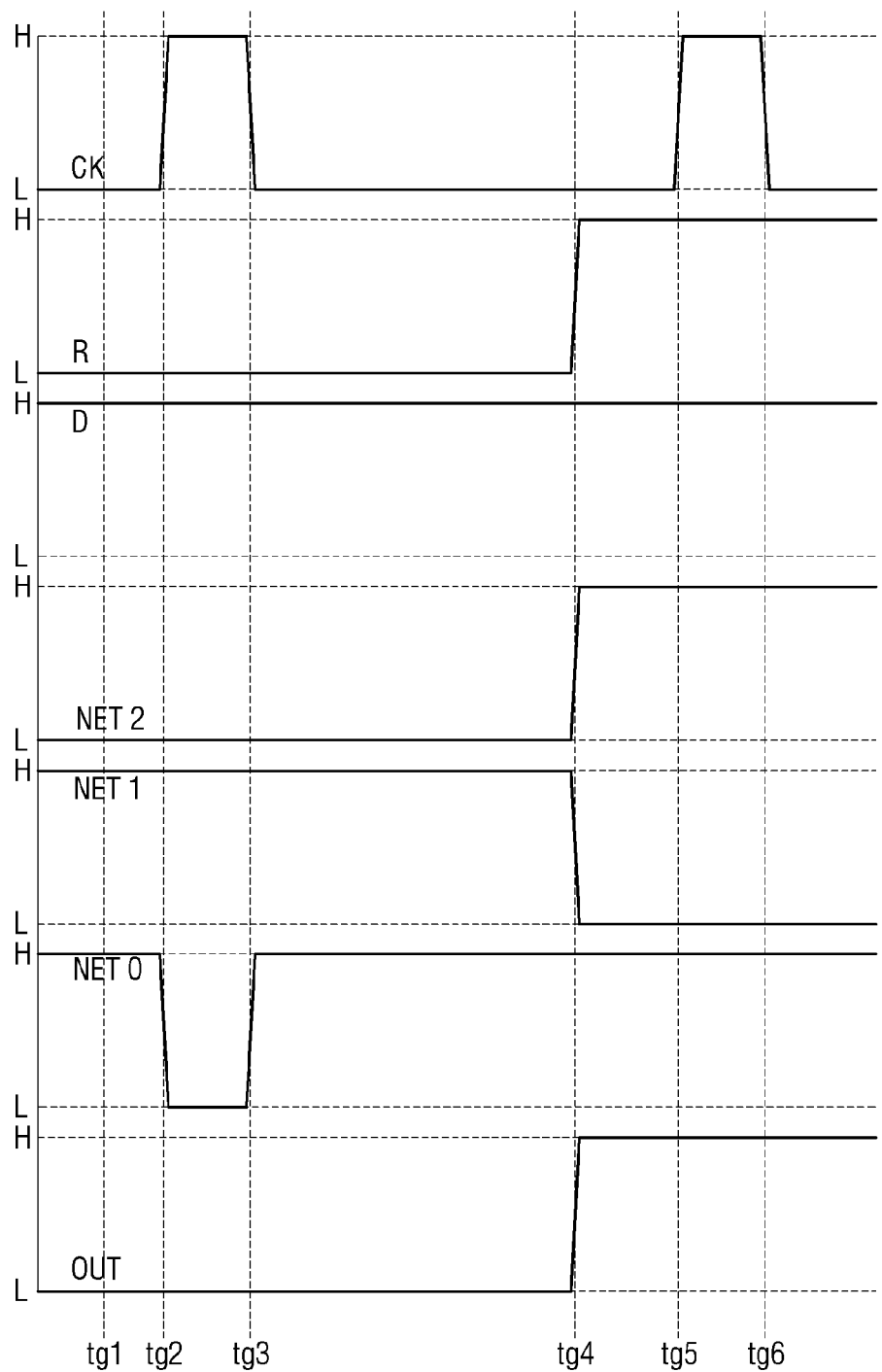
FIG. 14 is a timing chart for explaining the operation of the semiconductor circuit according to some embodiments of the present disclosure.

FIG. 14 is a timing chart for explaining the operation of the semiconductor circuit according to some embodiments of the present disclosure. Hereinafter, the same matters as the embodiments described above are not described, and the differences will be mainly described.

The semiconductor circuit according to some embodiments of the present disclosure may be operated in the substantially same manner as the semiconductor circuit described above with reference to FIGS. 4 to 7, when the reset signal R is non-activated (low level L).

However, when the reset signal R is activated (high level H), the logic level of the output terminal OUT of the semiconductor circuit may immediately become a high level H, regardless of whether the clock signal CLK rises.

FIG. 14 is a timing chart for explaining the operation of the semiconductor circuit, based on a case where the logic level of the input data D is the high level H. However, the present disclosure is not limited thereto.

Specifically, referring to FIG. 14, in the case of the times tg1, tg2, tg3, they may be substantially the same as the operation of the semiconductor circuit at the times tb1, tb2, tb3 described referring to FIG. 5.

However, at the time tg4, the logic level of the reset signal R is the high level H. At this time, the node NET 1 is discharged by the turning-on of the reset transistor R2.

In the second sub-circuit 122, since the gate G5 performs the OR operation of the logic level of the scan enable signal SE, the logic level (high level H) of the input data D and the logic level of the node NET 3, it transmits the high level H to the gate G4. The gate G4 performs the NAND operation of the logic level (high level H) of the output of the gate G5 and the logic level of the node NET 1, and transmits the output value to the node NET 2. That is, the logic level of the node NET 2 becomes opposite to the logic level of the node NET 1.

The node NET 1 is discharged as the reset signal R is activated. Therefore, the node NET 1 has a logic level of the low level L, and the node NET 2 has a logic level of the high level H.

The node NET 0 is pre-charged by the transistor PE1 which is gated to the logic level (low level L) of the node NET 1. Therefore, the logic level of the node NET 3 has a low level L.

In the latch circuit 310, as the logic level of the reset signal R becomes a high level H, the reset transistor R4 is turned on, and the logic level (low level L) of the node NET 3 is transmitted to the node NET 4. Therefore, the logic level of the output terminal OUT is determined as the high level H which is the inverted value of the logic level of the node NET 4.

Subsequently, at the time tg5 and the time tg6, since the logic level of the reset signal R is maintained at a high level H, the logic level of the output terminal OUT is maintained at the high level H, regardless of the logic level of the clock signal CLK.

Figure 15:
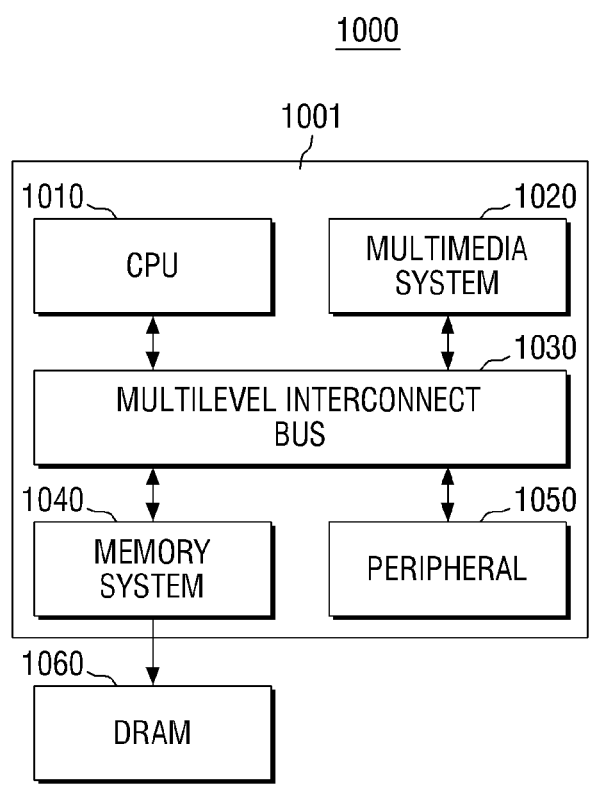
FIG. 15 is a block diagram of an SoC system including the semiconductor circuit according to the embodiments of the present disclosure.

FIG. 15 is a block diagram of an SoC system which includes the semiconductor circuit according to the embodiments of the present disclosure.

Referring to FIG. 15, an SoC system 1000 includes an application processor 1001, and a DRAM 1060.

The application processor 1001 may include a central processing unit 1010, a multimedia system 1020, a bus 1030, a memory system 1040 and a peripheral circuit 1050.

The central processing unit 1010 may perform the operations required for driving the SoC system 1000. In some embodiments of the present disclosure, the central processing unit 1010 may be constituted by a multi-core environment that includes multiple cores.

The multimedia system 1020 may be used to perform various multimedia functions in the SoC system 1000. The multi-media system 1020 may include a 3D engine module, a video codec, a display system, a camera system, a postprocessor and the like.

The bus 1030 may be used for data communication among the central processing unit 1010, the multimedia system 1020, the memory system 1040 and the peripheral circuit 1050. In some embodiments of the present disclosure, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and to be operated at high speed. In some embodiments of the present disclosure, the memory system 1040 may include a separate controller (e.g., a DRAM controller) needed to control the external memory (e.g., the DRAM 1060).

The peripheral circuit 1050 may provide an environment needed for the SoC system 1000 to be smoothly connected to an external device (e.g., mainboard). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In some embodiments of the present disclosure, the DRAM 1060 may be placed outside the application processor 1001 as illustrated. Specifically, the DRAM 1060 may be packaged with the application processor 1001 in the form of package on package (PoP).

The SoC system 1000 may include at least one of the semiconductor circuits according to the aforementioned embodiments of the present disclosure.

Further, the aforementioned SoC system 1000 may be applied to a personal digital assistant (PDA), a portable computer, a web tablet, a wireless phone, a mobile phone, a digital music player and a memory card, or all types of electronic products capable of transmitting or receiving information in a wireless environment.

Figure 16:
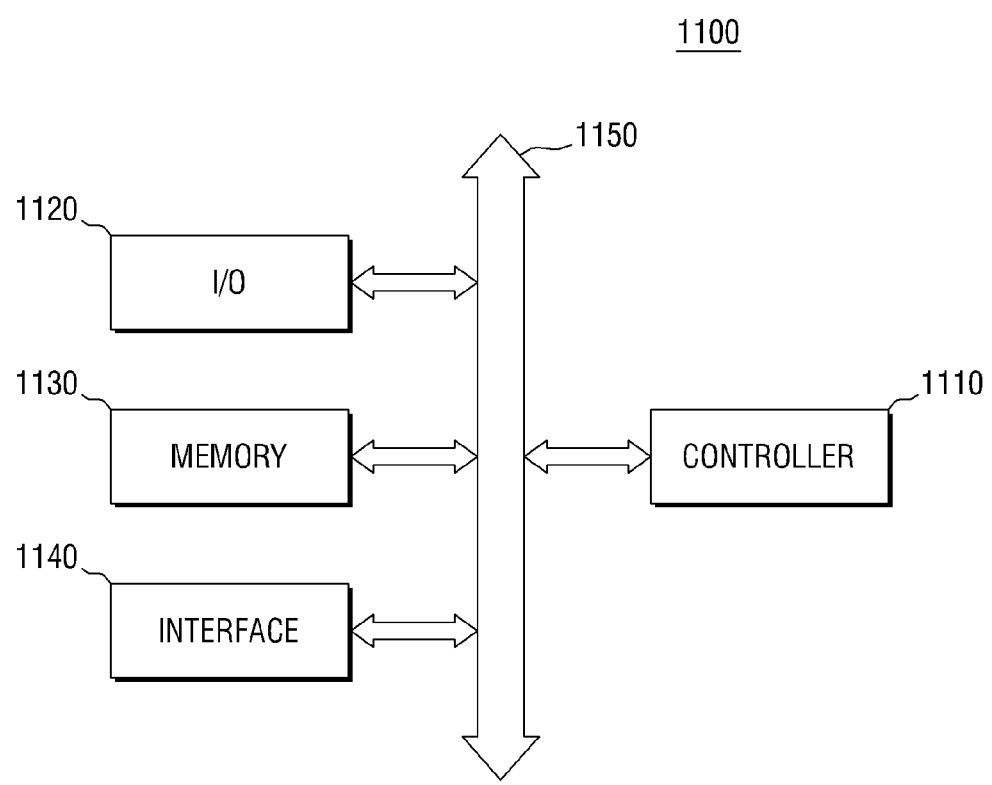
FIG. 16 is a block diagram of an electronic system including the semiconductor circuit according to the embodiments of the present disclosure.

FIG. 16 is a block diagram illustrating an electronic system including the semiconductor circuit according to the embodiments of the present disclosure.

Referring to FIG. 16, an electronic system 1100 according to the embodiment of the present disclosure may include a controller 1110, an input/output (I/O) device 1120, a memory device 1130, an interface 1140 and a bus 1150. The controller 1110, the I/O device 1120, the memory device 1130 and/or the interface 1140 may be connected to one another through the bus 1150. The bus 1150 corresponds to a path through which the data are moved.

The controller 1110 may include at least one of a microprocessor, a digital signal processor, a microcontroller and logic devices capable of performing similar functions to the elements. The I/O device 1120 may include a keypad, a keyboard and a display device. The memory device 1130 may store data and/or commands. The interface 1140 may serve to transmit data to or receive data from a communication network. The interface 1140 may be a wired or wireless interface. For example, the interface 1140 may include an antenna or a wired or wireless transceiver.

Although not shown in the drawing, the electronic system 1100 may have an operating memory for improving the operation of the controller 1110, and may further include a high-speed DRAM or SRAM.

The electronic system 1100 may be applied to a personal digital assistant (PDA), a portable computer, a web tablet, a wireless phone, a mobile phone, a digital music player and a memory card, or all types of electronic products capable of transmitting or receiving information in a wireless environment.

At least one of the semiconductor circuits according to the embodiments of the present disclosure may be adopted as at least one of the components of the electronic system 1100.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A semiconductor circuit comprising:
a first circuit which determines a logic level of a second node and a logic level of a third node, on the basis of a logic level of an input data, a logic level of a clock signal and a logic level of a first node; and
a second circuit which determines the logic level of the first node, on the basis of the logic level of the clock signal, the logic level of the second node and the logic level of the third node,
wherein the first circuit comprises:
a sub-circuit which determines the logic level of the second node, on the basis of the logic level of the input data and the logic level of the first node;
a first transistor which is gated to the logic level of the clock signal to connect the third node with the second node;
a second transistor which is gated to an inverted value of the logic level of the first node to pull up the third node; and
a third transistor which is connected in parallel to the second transistor and is gated to the inverted value of the logic level of the clock signal to pull up the third node.

2. The semiconductor circuit of claim 1, wherein the sub-circuit comprises:
a first gate which performs an OR operation of the logic level of the input data, the logic level of the fourth node and a logic level of a scan enable signal; and
a second gate which performs a NAND operation of the logic level of the output of the first gate and the logic level of the first node, and transmits the output value to the second node.

3. The semiconductor circuit of claim 1 wherein the sub-circuit comprises:
a first sub-transistor which is gated to the inverted value of the logic level of the fourth node to provide a power source voltage;
a second sub-transistor which is connected in series to the first sub-transistor, and is gated to the inverted value of the logic level of the input data;
a third sub-transistor which is connected in parallel to the first sub-transistor and the second sub-transistor connected in series to each other, and is gated to the inverted value of the logic level of the first node to pull up the second node;
a fourth sub-transistor which is gated to the logic level of the first node and transmits ground voltage to the second node;
a fifth sub-transistor which is connected between the fourth sub-transistor and the second node and is gated to the logic level of the input data; and
a sixth sub-transistor which is connected in parallel to the fifth sub-transistor, and is gated to the logic level of the fourth node.

4. The semiconductor circuit of claim 1, further comprising a latch circuit which determines a logic level of an output terminal on the basis of the logic level of the clock signal and the logic level of the third node.

5. The semiconductor circuit of claim 4, wherein the latch circuit comprises:
a first latch transistor which is gated to the inverted value of the logic level of the third node to pull up a fifth node;
a second latch transistor which is connected to a power source at one side and is gated to the logic level of the fifth node;
a third latch transistor which is connected in series to the second latch transistor at one side, is connected to the fifth node at the other end, and is gated to the inverted value of the logic level of the clock signal; and
an inverter which inverts the logic level of the fifth node and transmits it to the output terminal.

6. The semiconductor circuit of claim 1,
wherein the second circuit comprises:
a second transistor which is gated to the inverted value of the logic level of the clock signal to pull up the first node;
a third transistor which is gated to the inverted value of the logic level of the third node to pull up the first node;

a fourth transistor which is gated to the logic level of the third node to transmit the logic level of the first node;
a fifth transistor which is connected in series to the fourth transistor and is gated to the logic level of the second node; and
a sixth transistor which is connected in series to the fifth transistor and is gated to the logic level of the clock signal to transmit ground voltage.

7. The semiconductor circuit of claim 1,
wherein the second circuit comprises:
a second transistor which is gated to the inverted value of the logic level of the clock signal to pull up the first node;
a third transistor which is gated to the inverted value of the logic level of the second node to pull up the first node;
a fourth transistor which is gated to the logic level of the second node to transmit the logic level of the first node; and
a fifth transistor which is connected in series to the fourth transistor and is gated to the logic level of the clock signal to transmit ground voltage.

8. The semiconductor circuit of claim 7, wherein the second circuit further comprises:
a sixth transistor which is connected to the first node at one end and is gated to the logic level of the third node;
a seventh transistor which is connected in series to the sixth transistor and is gated to the logic level of a scan enable signal; and
an eighth transistor which is connected in series to the seventh transistor and is gated to the logic level of a scan input signal.

9. The semiconductor circuit of claim 7, wherein the second circuit comprises:
a first reset transistor which is connected between the second transistor and the first node and is gated to the inverted value of the logic level of a reset signal; and
a second reset transistor which is connected between the first node and the ground voltage and is gated to a logic level of the reset signal.

10. A semiconductor circuit comprising:
a first circuit which determines a logic level of a second node and a logic level of a third node, on the basis of a logic level of an input data, a logic level of a clock signal and a logic level of a first node;
a second circuit which determines the logic level of the first node, on the basis of the logic level of the clock signal, the logic level of the second node and the logic level of the third node;
a latch circuit which determines a logic level of an output terminal, on the basis of the logic level of the clock signal and the logic level of the third node;
a first latch transistor which is gated to an inverted value of the logic level of the third node to pull up a fifth node;
a second latch transistor which is connected to a power source at one side and is gated to the logic level of the fifth node;
a third latch transistor which is connected in series to the second latch transistor at one side, is connected to the fifth node at the other end, and is gated to an inverted value of the logic level of the clock signal; and
an inverter which inverts the logic level of the fifth node and transmits it to the output terminal, wherein
when the logic level of the clock signal is a first logic level, the logic level of the second node is transmitted to the third node, and the logic level of the third node is transmitted to the output terminal.

11. The semiconductor circuit of claim 10, wherein the logic level of the input data comprises a logic level that is different from the logic level of the second node.

12. The semiconductor circuit of claim 10, wherein the logic level of the first node or the third node is discharged at a positive edge of the clock signal.

13. The semiconductor circuit of claim 10, wherein, when the logic level of the clock signal is a second logic level different from the first logic level, the first circuit pre-charges the third node, and the second circuit pre-charges the first node.

14. The semiconductor circuit of claim 10, wherein, when the logic level of the input data is a second logic level different from the first logic level, the logic level of the second node comprises the first logic level.

15. The semiconductor circuit of claim 10, wherein, when the logic level of the input data is the first logic level, the logic level of the second node comprises a second logic level.

16. A semiconductor circuit comprising:
a first circuit which determines a logic level of a second node and a logic level of a third node, on the basis of a logic level of an input data, a logic level of a clock signal and a logic level of a first node;
a second circuit which determines the logic level of the first node, on the basis of the logic level of the clock signal, the logic level of the second node and the logic level of the third node; and
a latch circuit which determines a logic level of an output terminal on the basis of the logic level of the clock signal and the logic level of the third node, wherein:
when the logic level of the clock signal or the logic level of the third node is a first logic level, the first node is pre-charged,
when the logic level of the clock signal and the logic level of the second node is a second logic level different from the first logic level, the first node is discharged,
when the logic level of the clock signal or the logic level of the first node is the first logic level, the third node is pre-charged, and
when all of the logic level of the clock signal, the logic level of the input data and the logic level of the first node are the second logic level, the third node is discharged.

17. The semiconductor circuit of claim 16, wherein the logic level of the output terminal is the same as the logic level of the third node, when the logic level of the clock signal is the second logic level.

18. The semiconductor circuit of claim 16, wherein the logic level of the input data is the same as the logic level of the first node, when the logic level of the clock signal is the second logic level.

* * * * *